US010325800B2

(12) United States Patent
Kulshreshtha et al.

(10) Patent No.: US 10,325,800 B2
(45) Date of Patent: Jun. 18, 2019

(54) HIGH TEMPERATURE ELECTROSTATIC CHUCKING WITH DIELECTRIC CONSTANT ENGINEERED IN-SITU CHARGE TRAP MATERIALS

(71) Applicant: Applied Materials, Inc., Santa Clara, CA (US)

(72) Inventors: Prashant Kulshreshtha, San Jose, CA (US); Kwangduk Douglas Lee, Redwood City, CA (US); Bok Hoen Kim, San Jose, CA (US); Zheng John Ye, Santa Clara, CA (US); Swayambhu Prasad Behera, Santa Clara, CA (US); Ganesh Balasubramanian, Sunnyvale, CA (US); Juan Carlos Rocha-Alvarez, San Carlos, CA (US); Jian J. Chen, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 132 days.

(21) Appl. No.: 14/469,573

(22) Filed: Aug. 26, 2014

(65) Prior Publication Data

US 2016/0064264 A1    Mar. 3, 2016

(51) Int. Cl.
*H01L 21/687* (2006.01)
*H01L 21/683* (2006.01)

(52) U.S. Cl.
CPC .... *H01L 21/6833* (2013.01); *H01L 21/68757* (2013.01)

(58) Field of Classification Search
CPC .................. H01L 21/6833; H01L 21/68757
See application file for complete search history.

(56) References Cited

U.S. PATENT DOCUMENTS

| 5,360,986 | A | * | 11/1994 | Candelaria | H01L 29/161 |
| | | | | | 257/183 |
| 7,799,704 | B2 | | 9/2010 | Park et al. | |
| 2002/0041983 | A1 | * | 4/2002 | Nishioka | C04B 41/009 |
| | | | | | 428/698 |
| 2003/0047283 | A1 | * | 3/2003 | Parkhe | C23C 16/4581 |
| | | | | | 156/345.51 |
| 2006/0073349 | A1 | * | 4/2006 | Aihara | C04B 35/117 |
| | | | | | 428/469 |
| 2012/0190178 | A1 | * | 7/2012 | Wang | H01L 21/02529 |
| | | | | | 438/479 |

FOREIGN PATENT DOCUMENTS

| JP | H09008114 A | 1/1997 |
| JP | 2011521470 A | 7/2011 |

(Continued)

OTHER PUBLICATIONS

Office Action from Taiwan Patent Application No. 104122941 dated Sep. 15, 2017.

(Continued)

*Primary Examiner* — Karla A Moore
*Assistant Examiner* — Margaret D Klunk
(74) *Attorney, Agent, or Firm* — Patterson + Sheridan LLP

(57) ABSTRACT

Techniques are disclosed for methods and apparatuses for increasing the breakdown voltage while substantially reducing the voltage leakage of an electrostatic chuck at temperatures exceeding about 300 degrees Celsius in a processing chamber.

12 Claims, 6 Drawing Sheets

(56) References Cited

FOREIGN PATENT DOCUMENTS

| KR | 20100120199 | A | 11/2010 |
|----|----|----|----|
| TW | 517265 | B | 1/2003 |
| TW | I228786 | B | 3/2005 |
| TW | 201216406 | A | 4/2012 |
| WO | 0201611 | A2 | 1/2002 |

OTHER PUBLICATIONS

International Search Report and Written Opinion fro PCT/US2015/039296 dated Nov. 17, 2015.
Office Action from Korean Patent Application No. 10-2017-7003847 dated Feb. 25, 2019.

\* cited by examiner

HIGH TEMPERATURE ELECTROSTATIC CHUCKING WITH DIELECTRIC CONSTANT ENGINEERED IN-SITU CHARGE TRAP MATERIALS

BACKGROUND

Field

Embodiments described herein generally relate to methods and apparatuses for forming semiconductor devices. More particularly, embodiments described herein generally relate to methods and apparatuses for manufacturing semiconductor devices at elevated temperatures.

Description of the Related Art

Reliably producing nanometer and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at temperatures above 300 degrees Celsius, which may undesirably cause substrate bow in excess of 200 um. To prevent such excessive bowing, increased clamping force will be required to flatten the substrate and remove bow during film deposition and device processing. However, conventional electrostatic chucks present on substrate support assemblies utilized to clamp the substrate experience charge leakage at the temperatures above 300 degrees Celsius, which may degrade device yield and performance. Additionally, film deposition processes without chucking show backside film deposition on bowed wafers, which substantially increase lithography tool downtime due to contamination.

Thus, there is a need for an improved substrate support assembly having electrostatic chuck suitable for use at processing temperatures above 300 degrees Celsius, along with vacuum chambers and methods for using the same.

SUMMARY

An improved substrate support assembly having electrostatic chuck and method for processing a substrate utilizing the same are provided. The electrostatic chuck disclosed herein has a high breakdown voltage while substantially reducing the voltage leakage during operation at temperatures exceeding about 300 degrees Celsius.

In one example, a substrate support assembly is provided that includes a substantially disk-shaped ceramic body having an electrode disposed therein. The ceramic body has an upper surface, a cylindrical sidewall, and a lower surface. The upper surface is configured to support a substrate thereon in a vacuum processing chamber. The cylindrical sidewall defines an outer diameter of the ceramic body, while the lower surface is disposed opposite the upper surface. A silicon and carbon containing layer is adhered to the upper surface of the ceramic body. The silicon and carbon containing layer has a carbon content of less than about 5% by weight.

In another example, a method for processing a substrate is provided that includes depositing a silicon-based material on a substrate positioned on a substrate support assembly in a vacuum chamber, removing the substrate from the vacuum chamber, and depositing about 100 Å to 3000 Å of a silicon and carbon containing material on the substrate support assembly, the silicon and carbon containing material having a carbon content of less than about 5% by weight.

In another example, a method for processing a substrate is provided that includes pre-chucking the substrate while in a substrate support assembly in a vacuum processing chamber, wherein pre-chucking comprise exposing the substrate to an helium-comprising plasma, or plasma-less environment, in the vacuum processing chamber, chucking the substrate to the substrate support assembly, prior to depositing a layer of material on the substrate, dechucking the substrate, and removing the substrate from the high temperature vacuum chamber.

In yet another example, a vacuum chamber is provided that includes a chamber body having an internal volume, a substrate support assembly disposed in the internal volume, and an isolation transformer. The substrate support assembly has an electrostatic chucking electrode disposed therein. The isolation transformer is coupled to the electrostatic chucking electrode and is operable to prevent current leakage between the electrostatic chucking electrode and a power supply coupled to the electrostatic chucking electrode.

BRIEF DESCRIPTION OF THE DRAWINGS

So that the manner in which the above recited features of the embodiments can be understood in detail, a more particular description of the embodiments, briefly summarized above, can be had by reference to embodiments, some of which are illustrated in the appended drawings. It is to be noted, however, that the appended drawings illustrate only examples of the embodiments and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

An improved substrate support assembly having electrostatic chuck and method for processing a substrate utilizing the same are provided. The electrostatic chuck disclosed herein has a high breakdown voltage while substantially reducing the voltage leakage during operation at temperatures exceeding about 300 degrees Celsius. The electrostatic chuck includes a dielectric films coating and/or seasoning which inhibits charge leakage from the electrostatic chuck when operated at temperatures exceeding about 300 degrees Celsius. The dielectric films have a dielectric constant about 3 to 12. The dielectric constant may be tuned to control charge trapping and for modifying the clamping/chucking force at elevated temperatures. Also disclosed herein are methods for processing a substrate utilizing the improved substrate support assembly.

Figure 1:
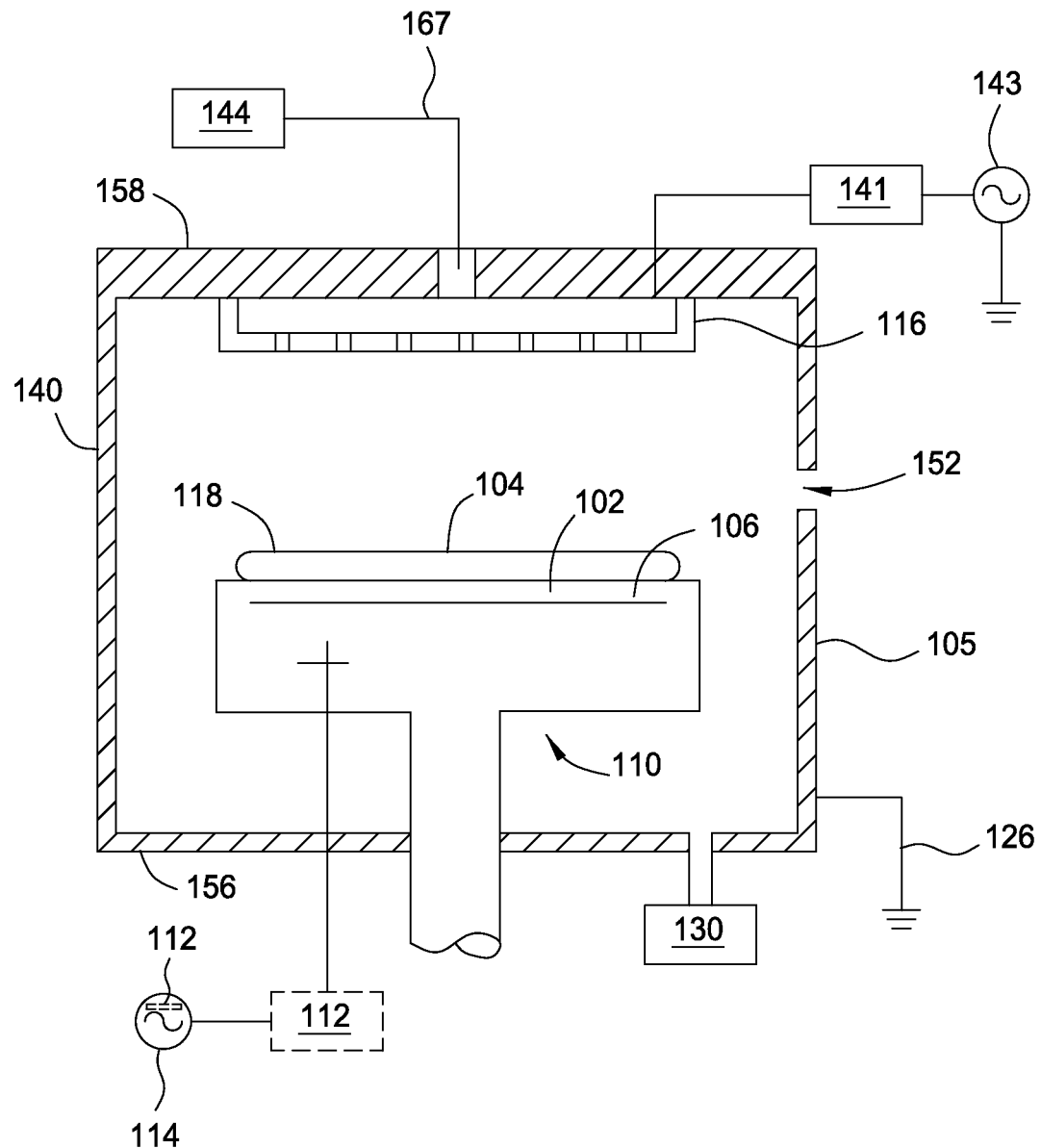
FIG. 1 is a cross section view of an illustrative vacuum processing chamber having a substrate support assembly in which embodiments of the disclosure may be practiced.

FIG. 1 shows a schematic side view of one embodiment of a vacuum processing chamber 100 having a substrate support assembly 110 on which a substrate 118 is processed. The processing chamber 100 may be a chemical vapor deposition (CVD) processing chamber, hot wire chemical vapor deposition (HWCVD) processing chamber, or other vacuum chamber for processing substrates at elevated temperatures.

The processing chamber 100 includes a chamber body 105 having a top 158, chamber sidewalls 140 and a chamber bottom 156 which are coupled to a ground 126. The top 158, the chamber sidewalls 140 and the chamber bottom 156 define an interior processing region 150. The chamber sidewalls 140 may include a substrate transfer port 152 to facilitate transferring the substrate 118 into and out of the processing chamber 100. The substrate transfer port 152 may be coupled to a transfer chamber and/or other chambers of a substrate processing system.

The dimensions of the chamber body 105 and related components of the processing chamber 100 are not limited and generally are proportionally larger than the size of the substrate 118 to be processed therein. Examples of substrate sizes include 200 mm diameter, 250 mm diameter, 300 mm diameter and 450 mm diameter, among others.

In one embodiment, a pumping device 130 is coupled to the bottom 156 of the processing chamber 100 to evacuate and control the pressure with the processing chamber 100. The pumping device 130 may be a conventional roughing pump, roots blower, turbo pump or other similar device that is adapted control the pressure in the interior processing region 150. In one example, the pressure level of the interior processing region 150 of the processing chamber 100 may be maintained at less than about 760 Torr.

A gas panel 144 supplies process and other gases through a gas line 167 into the interior processing region 150 of the chamber body 105. The gas panel 144 may be configured to provide one or more process gas sources, inert gases, non-reactive gases, and reactive gases, if desired. Examples of process gases that may be provided by the gas panel 144 include, but are not limited to, a silicon (Si) containing gases, carbon precursors and nitrogen containing gases. Examples of Si containing gases include Si-rich or Si-deficient nitride ($Si_xN_y$) and silicon oxide ($SiO_2$). Examples of carbon precursors include propylene, acetylene, ethylene, methane, hexane, isoprene, and butadiene, among others. Examples of Si containing gases include silane ($SiH4$), tetraethyl orthosilicate (TEOS). Examples of nitrogen and/or oxygen containing gases include pyridine, aliphatic amine, amines, nitriles, nitrous oxide, oxygen, TEOS, and ammonia, among others.

A showerhead 116 is disposed below the top 158 of the processing chamber 100 and is spaced above the substrate support assembly 110. As such, the showerhead 116 is directly above a top surface 104 of the substrate 118 when positioned on the substrate support assembly 110 for processing. One or more process gases provided from the gas panel 144 may supply reactive species through the showerhead 116 into the interior processing region 150.

The showerhead 116 also functions as an electrode for coupling power to gases within the interior processing region 150. It is contemplated that power may be coupled to the gases within the interior processing region 150 utilizing other electrodes or devices.

In the embodiment depicted in FIG. 1, a power supply 143 may be coupled through a match circuit 141 to the showerhead 116. The RF energy applied to the showerhead 116 from the power supply is inductively coupled to the process gases disposed in the interior processing region 150 to maintain a plasma in the processing chamber 100. Alternatively, or in addition to the power supply 143, power may be capacitively coupled to the process gases in the processing region 150 to maintain the plasma within the processing region 150. The operation of the power supply 143 may be controlled by a controller, (not shown), that also controls the operation of other components in the processing chamber 100.

As discussed above, the substrate support assembly 110 is disposed above the bottom 156 of the processing chamber 100 and holds the substrate 118 during deposition. The substrate support assembly 110 includes an electrostatic chuck (identified by reference numeral 220 in FIG. 2) for chucking the substrate 118 disposed thereon. The electrostatic chuck (ESC) 220 secures the substrate 118 to the substrate support assembly 110 during processing. The ESC 220 may be formed from a dielectric material, for example a ceramic material, such as aluminum nitride (AlN) among other suitable materials. The ESC 220 uses the electro-static attraction to hold the substrate 118 to the substrate support assembly 110. The ESC 220 includes a chucking electrode 106 connected to a power source 114 through an isolation transformer 112 disposed between the power source 114 and the chucking electrode 106. The isolation transformer 112 may be part of the power source 114 or separate from the power source 114, as shown by the dashed lines in FIG. 1. The power source 114 may apply a chucking voltage between about 50 Volts and about 5000 Volts to the chucking electrode 106. The ESC 220 may have a coating or layer attached thereto configured to inhibit current leakage at operational temperatures above about 300 degrees Celsius.

Figure 2:
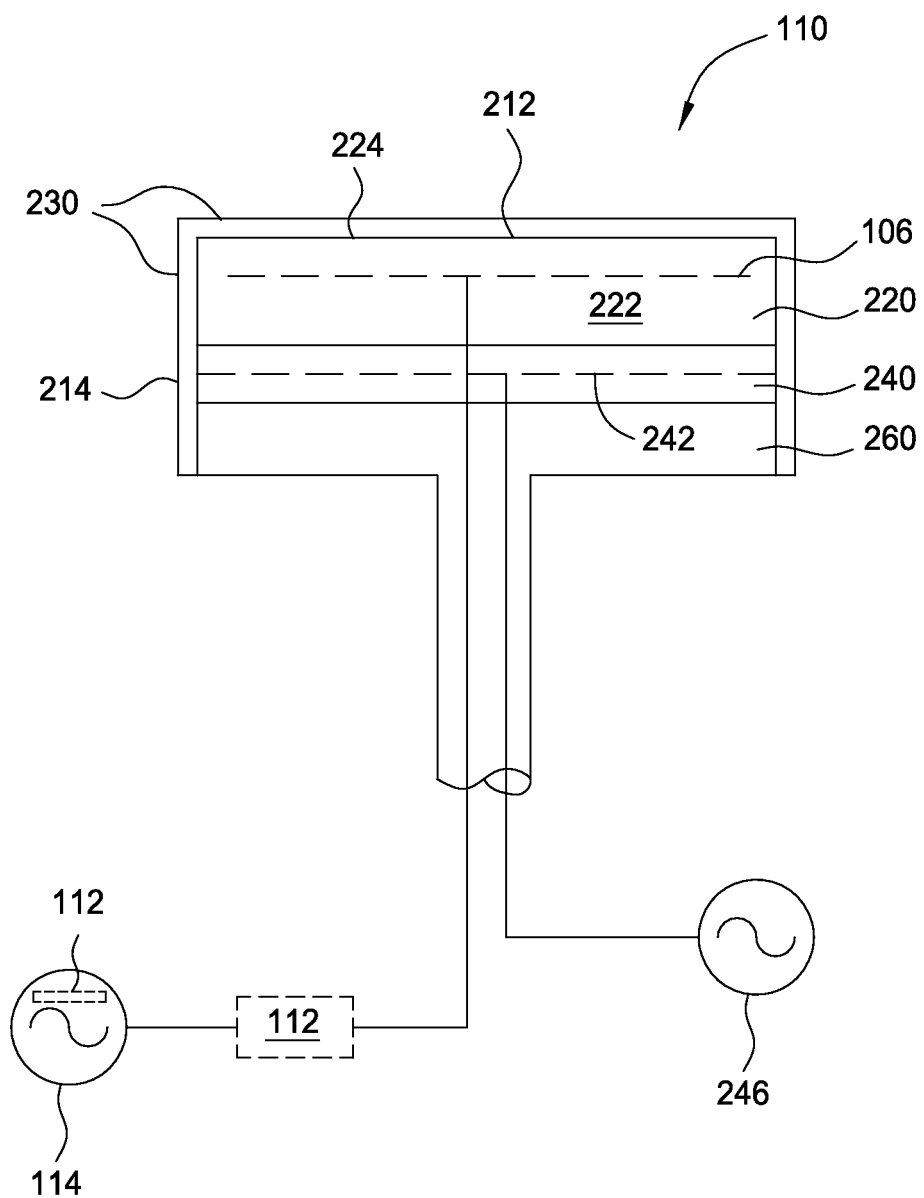
FIG. 2 shows a schematic side view of the substrate support assembly having one embodiment of an electrostatic chuck.

FIG. 2 is a schematic side view of the substrate support assembly 110. The substrate support assembly 110 has a top surface 212 and sides 214. The substrate support assembly 110 includes the ESC 220. The ESC 220 has a body 222 is formed from a dielectric material, for example a ceramic material such as aluminum nitride (AlN) or other suitable material. Additionally, the substrate support assembly 110 or body 222 of the ESC 220 may optionally include one or more of a heater 240, a cooling base (not shown) or a facility plate 260.

Figure 3:
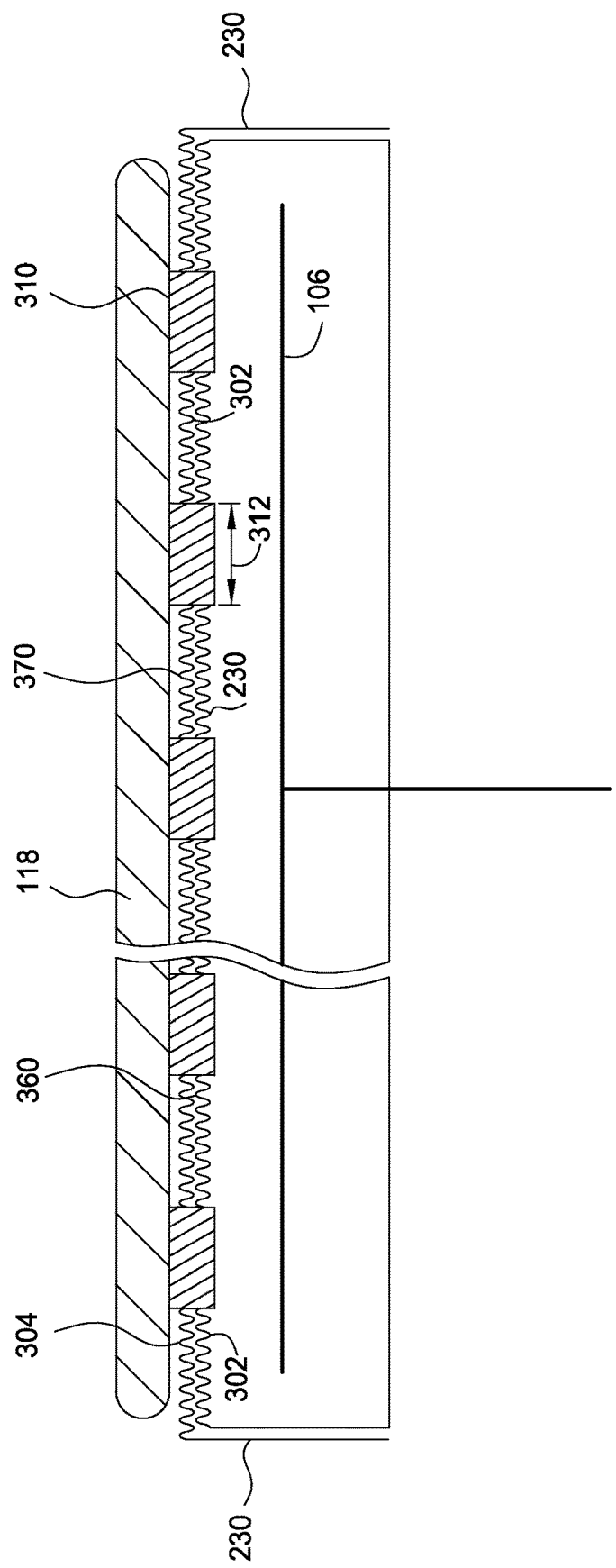
FIG. 3 illustrates an enlarged portion of the electrostatic chuck.

The body 222 has a top surface 224 upon which the substrate 118 is secured during processing. FIG. 3 illustrates a close up for a portion of the electrostatic chuck. Turning temporarily to FIG. 3, the top surface 224 has very flat areas 310 isolated by trenches 302. Alternately, the ESC 220 may forgo the flat areas 310 and rely on dimples 304 formed in the high areas surrounding the trenches 302. The flat areas 310 and trenches 302 may be formed in the ESC 220 and replicated in the coating material 230. Alternately, the flat areas 310 and trenches 302 may be formed solely in the coating material 230. The flat areas 310 may be formed from polished islands on the surface 212 of the ESC 220 and/or the coating material 230.

The flat areas 310, or dimples 304, provide support for the substrate 118 and contact while the trenches 302 store charge for the chucking forces. The chucking forces increase with the increase in the effective contact areas 312 provided by the dimples 304 or flat areas 310. The effective contact area 312 may be increase by adjusting the number of dimples 304, roughening the surface 212 of the ESC 220, or increasing the number or size of the flat areas 310. An optimum ratio of flat areas 310 to trenches 302 may be determined for maximizing the chucking forces which will increase the effective chucking voltage. An increase in the effective chucking voltage permits the reduction in the actual chucking voltage. Additionally, the configuration of trenches 302 to flat areas 310 for the top surface 224 minimizes back-side substrate damage at high chucking forces by distributing the chucking load more uniformly.

Referring back to FIG. 2, the heater 240 may include main heaters 242. The main heaters 242 may be resistive heaters, or other suitable heater. A power source 246 may be coupled the main heaters 242 to control the temperature of the substrate support assembly 110, and therefore, the substrate 118 disposed thereon. The main heaters 242 may be configured to heat the top surface 212 of the substrate support assembly 110 to between about 100 degrees Celsius to about 700 degrees Celsius, such as about 300 degrees Celsius to about 400 degrees Celsius.

The chucking electrode 106 is embedded within the body 222 of the ESC 220. The power source 114 may be in communication with a system controller for controlling the operation of the chucking electrode 106 by directing a DC current to the chucking electrode 106 for chucking and optionally de-chucking the substrate 118. The power source 114 may supply a chucking voltage in a range from about 50 VDC to about 5000 VDC to the chucking electrode 106 of the ESC 220 for chucking the substrate 118.

During utilized at temperatures above about 300 degrees Celsius, ceramic materials, such as those utilized to fabricate the body 222 of the ESC 220, may disadvantageously allow DC current to leak through the body 222 of the ESC 220 to ground. The source of the DC current may be either the main heater 242 and/or the chucking electrode 106. The presence of the isolation transformer 112 between the chucking electrode 106 and the power source 114 substantially prevents flowing of DC current between the chucking electrode 106 and ground. Optionally, a second isolation transformer 112 may be provided between the main heaters 242 and the power source 114 to substantially prevent flowing of DC current between the main heaters 242 and ground. With less current leakage, less power is needed to drive the chucking electrode 106 and main heaters 242.

At least the top surface 224 of the body 222 includes a coating or layer of material selected to inhibit DC current from flowing between the chucking electrode 106 and the substrate 118 at temperatures greater than 300 degrees Celsius. Reducing and/or preventing DC current from flowing between the chucking electrode 106 and the substrate 118 prevents substrate device damage, promotes process uniformity and increases device yield. Additionally, reducing and/or preventing current leakage between the chucking electrode 106 and the substrate 118 reduces the amount of power utilized to generate a given amount of chucking force. Thus, when operated at temperatures greater than 300 degrees Celsius, the ESC 220 generates greater chucking force with less power compared to similar conventional electrostatic chucks. Therefore, at high temperatures such as at or above 300 degrees Celsius, large chucking forces can be generated to substantially flatten the substrate 118 with less power consumption and with less risk of substrate damage due to current leakage as compared to similar conventional electrostatic chucks.

For example, a coating material 230 may be formed on at least the top surface 224 of the body 222 of the ESC 220. The coating material 230 may also be formed on the sides 214 of the substrate support assembly 110 and/or the sides of the body 222 of the ESC 220. The coating material 230 may be a dielectric material selected to substantially reduce DC current leakage through the body 222 to the substrate 118. The composition of the coating material 230 may be selected to limit the leakage to less than or equal to about 25 mA, for example less than or equal to about 10 mA, when the Esc 220 is at temperatures of between about 300 degrees Celsius and about 700 degrees Celsius. In one example, the coating material 230 may be formed from a silicon and carbon containing material.

The coating material 230 may be a disposed on the substrate support assembly 110 outside of the processing chamber, and/or be periodically applied to the substrate support assembly 110 in-situ the processing chamber, for example using a seasoning process. The coating material 230 may be applied by a chemical vapor deposition process, a spray process, a dipping process, a thermal process or deposited formed in another suitable manner. The coating material 230 may optionally be in the form of a liner disposed over the substrate support assembly 110.

The coating material 230, when deposited as a coating outside of the processing chamber, may have a thickness of about 1 µm to about 1000 µm. The coating material 230, when present in the form of a liner disposed over the substrate support assembly 110, may have a thickness of about 100 Å to about 100000 Å. The coating material 230, when deposited in-situ the processing chamber for example by seasoning, may have a thickness of about 100 Å to about 3000 Å, which may applied over an existing layer of coating material 230.

The coating material 230 has a high breakdown voltage of at least about 100 MV/cm. For example, the coating material 230 may have a high breakdown voltage of between about 100 MV/cm and about 600 MV/cm. The high breakdown voltage permits higher chucking voltages for increased the chucking force while allowing quicker buildup and discharging of the chucking electrode 106 for rapid chucking and dechucking the substrate.

The coating material 230 may optionally be doped with carbon. For example, the coating material 230 may comprise a silicon-based material doped with a carbon containing material, wherein the carbon content of the coating material 230 is less than about 5% by weight. Good chucking performance at elevated temperatures has been demonstrated with such a material having a deposited in-situ thickness of between about 100 Å to about 1000 Å.

The coating material 230 can be deposited using silicon (Si) containing precursor gases, carbon precursors, and nitrogen and oxygen containing precursor gases. Examples of Si containing gases include Si-rich or Si-deficient nitride ($Si_xN_y$) and silicon oxide ($SiO_2$). Examples of carbon precursors include propylene, acetylene, ethylene, methane, hexane, hexane, isoprene, and butadiene, among others. Examples of Si containing gases include silane ($SiH_4$), tetraethyl orthosilicate (TEOS). Examples of nitrogen containing gases include pyridine, aliphatic amine, amines, nitriles, and ammonia, among others. Si-rich or deficient silicon nitride ($Si_xN_y$) and silicon oxide ($SiO_2$) films provide dielectric constant tuning to allow controlled charge trapping during electrostatic chucking of the substrates. The coating material 230 may be formed from one or more film layer.

The coating material 230 may also be selected based on its refractive index and dielectric properties. The coating material 230 is evaluated for the refractive index and temperature dependent leakage current. A lower refractive index may correspond to a better, i.e., higher, dielectric constant. A capacitance (C) voltage (V) measurement, C-V measurement, may be used to determine the electrical charge leakage. The coating material 230 may then be selected having high dielectric constant and low voltage leakage rate.

Additionally, at the higher temperatures, i.e., temperatures greater than about 300 degrees Celsius, the coating material 230 also allows nearly instantaneous charge dissipation to de-chuck the substrate. Modulating amounts of carbon doping in $Si_xN_y$ and $SiO_2$ films allows control over charge leakage to assist rapid de-chucking in the ESC 220.

The coating material 230 may be uniformly coated (i.e., seasoned) onto the substrate support assembly 110 during various plasma processing steps, such as hardmask deposition, silicon deposition, nitride deposition, oxide deposition and etch, among others. Backside film deposition, erroneous plasma coupling, plasma impedance loss and film thickness variation can be evaluated and mitigated with the coating material 230. The coating material 230 may be tuned to allow consistency of film properties formed on the chucked substrates where the chucked substrates may have a bow from about (−) 400 um (i.e. compressive) to (+) 400 um (i.e. tensile).

Figure 4:
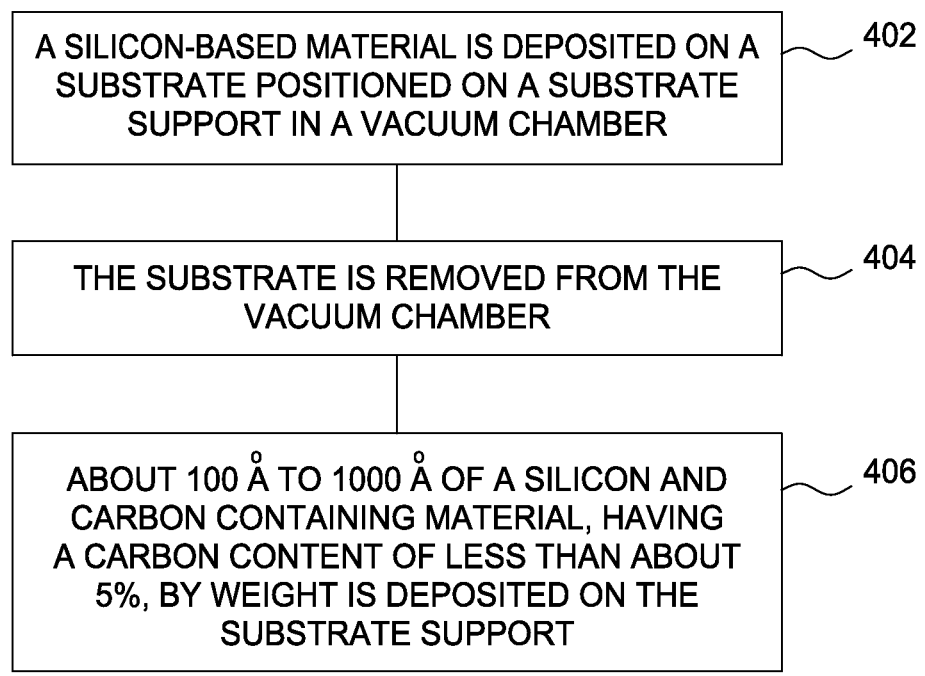
FIG. 4 is a flow diagram of a method for using the substrate support assembly while processing a substrate in a vacuum processing chamber.

FIG. 4 is a flow diagram of a method 400 for using the substrate support assembly 110 while processing the substrate 118 in a vacuum processing chamber, such as the processing chamber 100 described above. The method 400 is suitable for processing substrates while the substrate support assembly 110 is at a temperature exceeding 300 degrees Celsius. The method 400 starts at block 402 by depositing a layer of material on a substrate positioned on a substrate support in a vacuum chamber. The layer of material may be a silicon-based material, among others. The silicon-based material may be deposited using a chemical vapor deposition process, or other suitable process. The silicon-based material may be one or more layers of amorphous silicon, polycrystalline silicon, microcrystalline silicon, silicon nitride, silicon oxide, and silicon oxynitride, among others. At block 404 the substrate is removed from the vacuum chamber.

At block 406, a coating material 230 is deposited on the substrate support assembly while the substrate has been removed from the processing chamber. The coating material 230 may have a thickness of about 100 Å to 1000 Å. The coating material 230 may comprise a silicon and carbon containing material, for example a silicon base material doped with carbon, wherein the carbon content is less than about 5% by weight.

The coating material 230 may be deposited in-situ during a carbon cleaning operation performed after depositing the silicon-based material at block 402 and removing the substrate from the substrate support assembly at block 404. Application of the coating material 230 may be performed in-situ after several carbon cleaning operations.

Figure 5:
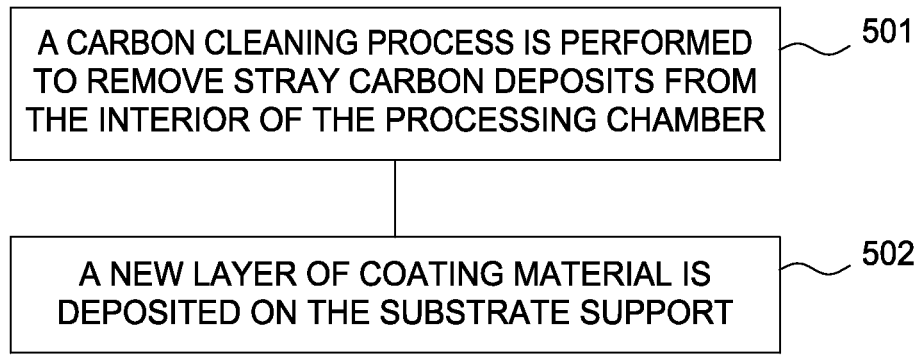
FIG. 5 is a flow diagram of a seasoning operation which includes a carbon cleaning method which may be utilized to apply a coating material to a substrate support assembly.

FIG. 5 is a flow diagram for a seasoning operation 500 which includes a carbon cleaning method which may be utilized to apply the coating material 230. For example, the seasoning operation 500 may be utilized to deposit the coating material 230 on the substrate support assembly as described at block 406 in the method 400 described with reference to FIG. 4.

The seasoning operation 500 may include a number of operations of which a portion may be for cleaning the processing chamber and ESC. The seasoning operation 500 may remove some of the coating material 230 previously applied to the substrate support assembly 110.

The seasoning operation 500 begins at block 501 by performing a carbon cleaning process to remove stray carbon deposits from the interior of the processing chamber. The carbon cleaning process at block 501 includes pumping out the processing chamber to remove residual process gasses. In one example, the interior volume of the processing chamber may optionally be maintained at about 550 degrees Celsius and at about 0 Torr. Argon (Ar) gas is introduced into the interior volume, for example at a flow rate of about 2000 sccm to about 12000 sccm, such as about 5600 sccm. Plasma is formed from the Ar gas utilizing power coupled to the showerhead. For example, about 10000 Watts of power may be coupled to the Ar gas to maintain a plasma in the processing chamber. Nitrogen fluoride ($NF_3$) may be provided into the processing chamber in conjunction with the flow of Ar gas. For example, $NF_3$ may be provided into the processing chamber at a flow rate of about 100 sccm to about 500 sccm, such as about 200 sccm. In some scenarios, the flow of $NF_3$ may even be as high as about 4000 sccm, such as during cleaning. The flow rate of $NF_3$ provided to the processing chamber may be increased, for example up to about 800 sccm, while the pressure within the interior volume is raised to about 5 torr for about 2 minutes. The flow of $NF_3$ is then turned substantially off while the flow of Ar gas is maintained, during which the processing chamber is pumped down, for example to about 0 torr. Once the processing chamber has been pumped sufficiently down, the flow of Ar gas is turned off.

At block 502, a new layer of coating material is deposited on the substrate support. The new layer of coating material may compensate for any coating material that may have been removed during the carbon cleaning process. The interior volume of the processing chamber may optionally be maintained at about 550 degrees Celsius and at about 2.7 Torr during block 502. The new coating layer is applied by flowing nitrous oxide ($N_2O$) into the processing chamber, for example at a flow rate of about 2000 sccm to about 15000 sccm, such as about 5000 sccm. After about a predetermine period of time, for example about 15 seconds, a flow of silane ($SiH_4$), for example at about 100 sccm to about 1500 sccm, such as 550 sccm, is introduced into the processing chamber along with the flow of $N_2O$. After a predetermined period of time, for example about 5 seconds, about power is applied to the showerhead for maintaining plasma in the processing chamber volume for depositing the coating material on the substrate support assembly. In one example, about 100 to about 1500 Watts, such as about 500 Watts, at a frequency of 13.56 MHz is utilized to maintain the plasma within the processing chamber. After a predetermined period of time, the flow of $SiH_4$ and the power to the showerhead is turned off. After the flow of $SiH_4$ is stopped, the flow of $N_2O$ is also stopped and the processing chamber is pumped to a pressure of about 0 Torr.

Figure 6:
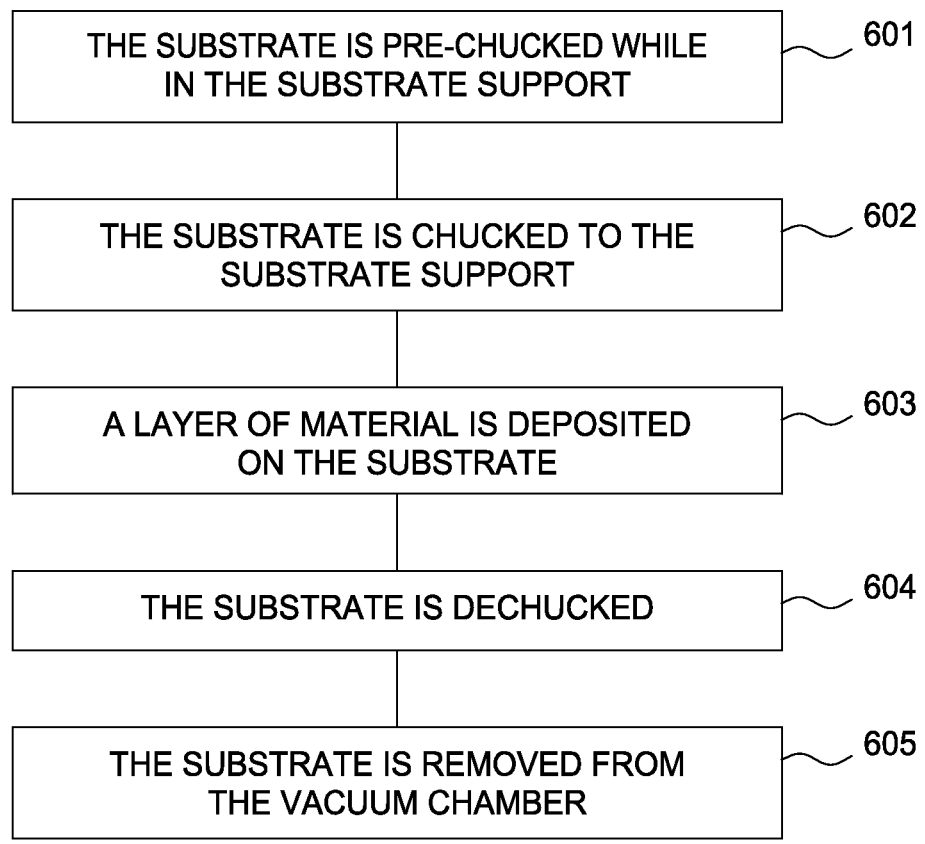
FIG. 6 is another flow diagram of a method for using the substrate support assembly while processing a substrate in a vacuum processing chamber.

FIG. 6 illustrates a method 600 for processing a substrate on a substrate support assembly of a vacuum chamber. The method is even effective for processing substrates having a greater than 200 um bow and large center-to-edge temperature profiles on the electrostatic chuck (ESC). The substrate support assembly has a coating material as discussed above. The method 600 begins at block 601 by pre-chucking the substrate on the substrate support disposed in the vacuum chamber. During the pre-chucking process, the substrate is exposed to a helium (He) comprising gas at a pressure of about 3-5 Torr. The helium (He) comprising gas may be argon-less (Ar). The flow of He into the vacuum chamber is provided at a rate of about 500 sccm to about 5000 sccm. The substrate may be exposed to the gas with or without plasma application which minimizes gas-based plasma damage to the vacuum chamber. The pre-chucking treatment allows a bowed substrate chucking in environments where the substrate support has up to about 20 degree Celsius center to edge temperature profile.

At block 602 the pre-chucking of the substrate continues by chucking the substrate to the substrate support assembly after a stable flow of the pre-chucking gases and pressure has been established in vacuum chamber. The substrate may be chucked to the substrate support assembly by applying a chucking voltage of about 100V to about 1000V to the chucking electrode disposed in the ESC. In one embodiment, about 50 W to about 300 W of RF power at about 13.56 MHz is applied to maintain a plasma within the processing chamber during the pre-chucking with the ESC voltage on. The RF based plasma enhances charge transfer between substrate and coating surface to generate chucking force. In another embodiment, RF based plasma is not applied during the pre-chucking with the ESC voltage on. The substrate support assembly may be held at a temperature above about 300 degrees Celsius. The pre-chucking of the substrate described at blocks 601 and 602 ends with the deposition of a layer of material on the substrate.

At block 603, a layer of material is deposited on the substrate while thee substrate is chucked on the substrate support assembly. The layer of material may be a silicon-based, or carbon-based material, among others. The silicon-based material may be deposited using a chemical vapor deposition process, or other suitable process. The silicon-based material may be one or more layers of amorphous silicon, polycrystalline silicon, microcrystalline silicon, silicon nitride, silicon oxide, and silicon oxynitride, among others. Alternatively, a layer of material may be etched from the substrate at block 603, for example, using a suitable etching technique. At block 603, the substrate is maintained at a temperature greater than about 300 degrees Celsius.

The coated substrate support assembly allows the substrate to be chucked at high temperatures without significant charge leakage while providing sufficient force to flatten the substrate without using excessively high voltages. Thus, the coated substrate support assembly enhances the ability to deposition nanometer and smaller features in a circuit having a high density within the vacuum chamber at temperatures exceeding 300 degrees Celsius, for example up to at least about 800 degrees Celsius.

After the process at block 603 is completed, the substrate is dechucked from the substrate support assembly at block 604. A plasma may be utilized to help dissipate the chucking force while dechucking the substrate. In one example, the plasma utilized during dechucking may be formed from He. He may be flowed into the processing chamber at a rate of about 3000 to about 4000 sccm. Plasma may be formed from the He by providing about 200 Watts to about 250 Watts of energy to the showerhead. A high breakdown voltage obtained through carbon doping of the coating material substantially hastens the dissipation of the chucking power when the chucking voltage is turned off, thus allowing faster dechucking times for faster substrate throughput.

At block 605, the substrate is removed from the vacuum chamber. With the substrate removed from the vacuum chamber, ESC may be cleaned and/or seasoned in-situ the vacuum chamber as described above.

Thus, the methods and apparatuses described herein advantageously reduce the voltage leakage of an electrostatic chuck when operated at temperatures exceeding about 300 degrees Celsius. The ESC may therefore be useful for chucking and flattening a substrate at these temperatures. Also described in a vacuum chamber having a chamber body, substrate support assembly and an isolation transformer. The chamber body has an internal volume in which is disposed the substrate support assembly. The substrate support assembly has an electrostatic chucking electrode which is coupled to the isolation transformer. The isolation transformer advantageously reduces current leakage, thus allowing less power to be utilized to chuck the substrate.

While the foregoing is directed to embodiments of the present disclosure, other and further embodiments can be devised without departing from the basic scope thereof, and the scope thereof is determined by the claims that follow.

We claim:

1. A substrate support assembly comprising:
   a substantially disk-shaped ceramic body having an upper surface, a cylindrical sidewall, and a lower surface, the upper surface configured to support a substrate thereon in a vacuum processing chamber, the cylindrical sidewall defining an outer diameter of the ceramic body, the lower surface disposed opposite the upper surface;
   an electrode disposed in the ceramic body; and
   a silicon and carbon containing layer adhered to and fully covering the upper surface and configured to contact the substrate supported on the upper surface, the silicon and carbon containing layer having a carbon content of less than about 5% by weight and consisting essentially of a silicon-based material doped with a carbon containing material.

2. The substrate support assembly of claim 1, wherein the silicon and carbon containing layer comprises:
   at least one in-situ deposited layer having a thickness of between about 100 Å to 3000 Å.

3. The substrate support assembly of claim 2, wherein the silicon and carbon containing layer has a break down voltage of at least 100 MV/cm.

4. The substrate support assembly of claim 3, wherein the silicon and carbon containing layer has a current leakage rate of less than about 10 mA at 500 VDC and at a temperature of between about 300 degrees Celsius and about 700 degrees Celsius.

5. The substrate support assembly of claim 1, wherein the silicon and carbon containing layer has a break down voltage of at least 100 MV/cm.

6. The substrate support assembly of claim 5, wherein the ceramic body with the silicon and carbon containing layer thereon has a current leakage rate of less than about 10 mA at 500 VDC while at a temperature of between about 300 degrees Celsius and about 800 degrees Celsius.

7. The substrate support assembly of claim 1, wherein the electrode is configured for electrostatically securing the substrate to the upper surface of the ceramic body.

8. The substrate support assembly of claim 7, further comprising:
a heater electrode disposed in the ceramic body.

9. The substrate support assembly of claim 1, wherein the silicon and carbon containing layer has a current leakage rate at 500 VDC of less than about 25 mA at 300 degrees Celsius.

10. The substrate support assembly of claim 1, wherein the silicon and carbon containing layer further comprises at thickness of about 100 Å to about 100,000 Å.

11. The substrate support assembly of claim 1, wherein the silicon and carbon containing layer comprises separately deposited layers of the silicon-based material doped with the carbon containing material.

12. The substrate support assembly of claim 1, wherein the upper surface further comprises:
a plurality of flat areas isolated by trenches.

* * * * *